United States Patent [19]

Togei

[11] Patent Number: 4,672,408
[45] Date of Patent: Jun. 9, 1987

[54] NON-VOLATILE SEMICONDUCTOR MEMORY DEVICE

[75] Inventor: Ryoiku Togei, Machida, Japan

[73] Assignee: Fujitsu Limited, Kawasaki, Japan

[21] Appl. No.: 841,050

[22] Filed: Mar. 17, 1986

Related U.S. Application Data

[63] Continuation of Ser. No. 690,392, Jan. 8, 1985, abandoned, which is a continuation of Ser. No. 322,721, Nov. 18, 1981, abandoned.

[30] Foreign Application Priority Data

Nov. 20, 1980 [JP] Japan ................................ 55-163596

[51] Int. Cl.⁴ ...................... H01L 29/78; H01L 29/04
[52] U.S. Cl. ........................................ 357/23.5; 357/59
[58] Field of Search ...................... 357/23.5, 23.14, 59

[56] References Cited

U.S. PATENT DOCUMENTS

| | | | |
|---|---|---|---|
| 3,590,272 | 6/1971 | Keshavan | 357/23 VT |
| 3,649,884 | 3/1972 | Haneta | 357/23 VT |
| 3,878,549 | 4/1975 | Yamazaki et al. | 357/23 VT |
| 3,974,003 | 8/1976 | Zirinsky et al. | 357/23 VT |
| 4,012,762 | 3/1977 | Abe et al. | 357/59 |
| 4,062,039 | 12/1977 | Nishimura | 357/41 |

Primary Examiner—Gene M. Munson
Attorney, Agent, or Firm—Staas & Halsey

[57] ABSTRACT

A non-volatile memory device which stores data by capturing charges in an amorphous semiconductor layer. The amorphous semiconductor layer is provided between a gate electrode and a semiconductor substrate via an insulating film and its edge is in contact with at least the one of the source or drain electrodes in the semiconductor substrate. When a high voltage (10 V or higher) is applied to the gate electrode, an electric field is generated and thereby charges are injected into the amorphous semiconductor layer from the source and-/or drain electrode and a write operation is thus carried out. An erasing operation is carried out by injection of charges of inverse polarity. This memory device offers advantages of low operating voltage and excellent charge sustaining characteristic, resulting from the fact that the write operation is attained independently of the gate insulating film.

11 Claims, 1 Drawing Figure

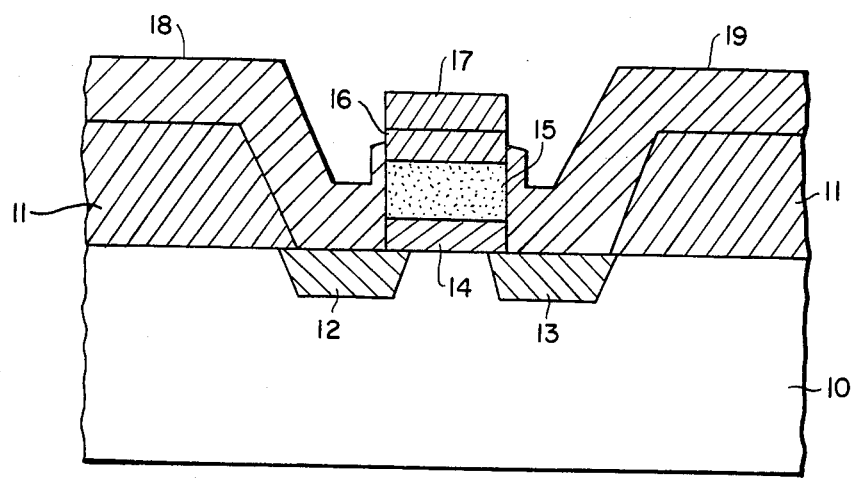

NON-VOLATILE SEMICONDUCTOR MEMORY DEVICE

This is a continuation of U.S. Ser. No. 690,392, filed Jan. 8, 1985, which is a continuation of U.S. Ser. No. 322,721, filed Nov. 18, 1981, both of which are abandoned.

FIELD OF THE INVENTION

The present invention relates to a semiconductor memory device, particularly to a non-volatile memory device which can store the alterable data currently stored even after the supply of power souce voltage is suspended.

BACKGROUND OF THE INVENTION

Some types of non-volatile semiconductor memory devices are already proposed and many of them provide the structure similar to ordinary MIS FETs. A typical type of memory device provides many trap charges within the gate insulating film and stores binary states represented by changes of gate threshold voltage caused by charges in these traps. The memory device of this type is disclosed, for example, in the U.S. Pat. No. 3,549,911. Other typical types of such memory devices are memories providing a floating gate for storing charges, which are disclosed, for example, in the U.S. Pat. Nos. 3,500,142; 3,797,000; and 3,825,946.

For these non-volatile memory devices, two kinds of mechanisms are utilized for injection of charges to the charge traps or to the floating gate for data writing. One is the tunnel injection method where charges are injected through very thin insulating film by means of the tunnel effect and the other is the avalanche injection method where hot carriers generated by the avalanche phenomenon are injected through comparatively thick insulating film. Both of these methods are disclosed in the cited U.S. patents.

The tunnel injection method has a disadvantage in that the insulating film thickness, even in the case of maximum thickness, through which the charges pass by means of the tunnel phenomenon, is only about 100 Å and such ultrathin insulating film is inferior in the reproducibility thereof, and tends to have many pin-holes which shortens the charge storing period. In the case of the avalanche injection method, the charge injection is possible through the thickness of insulating film even when it has a thickness of 1000 Å. However, when injection of avalanche hot carriers is repeated, the insulating film may easily be damaged so as to adversely effect the charge storing characteristic. Therefore, the number of repetitions of write operation is liable to be restricted and this tendency is undesirable for memory devices. A further serious disadvantage of the avalanche injection system is that application of voltage as high as, for example, 35 volts, is required for write operation. A reduction of write voltage is still required as an essential condition even for the tunnel injection system.

Various problems explained above result from such an essential process of write operation in the existing memory devices that charges are injected through the insulating film, and therefore it is difficult to completely eliminate such problems so long as such write operation is utilized.

In addition to the typical non-volatile memory device diclosed in the above prior art devices, also known is a non-volatile memory device utilizing remnant polarization of a gate insulating film consisting of ferroelectric material, which is disclosed, for example, in the U.S. Pat. No. 2,791,760. In this case, the write voltage is extremely high. Moreover, the ferroelectric material is not yet fully investigated for adaptability to a semiconductor process, and this memory device is still far from a practical application. It is desirable for obtaining practical memory devices to utilize the structures of silicon (Si)-silicon dioxide ($SiO_2$) or silicon nitride ($Si_3N_4$) which are obtained in the prior art, as the structure of semiconductor-insulator.

SUMMARY OF THE INVENTION

It is an object of the present invention to provide a non-volatile semiconductor memory device which can reduce the write voltage.

It is another object of the present invention to provide a non-volatile memory device which does not cause a problem of destroying the stored charges due to the pinholes in the insulating film which is often observed in the prior art.

It is a further object of the present invention to provide a non-volatile memory device which does not show deterioration of charge storing characteristics even when the write operation is repeated.

It is a still further object of the present invention to provide a non-volatile memory device which can realize a write operation without charge injection through an insulating film and therefore does not allow the write characteristic and stored charge sustaining characteristic to depend on the characteristic of the insulating film.

It is an additional object of the present invention to provide a non-volatile memory device which can be produced with the materials ordinarily used in existing semiconductor technique without using special materials such as ferroelectric material.

The non-volatile semiconductor memory device of the present invention comprising;

a semiconductor substrate of one conductivity type; source and drain regions of a second conductivity type opposite the first conductivity type provided in the semiconductor substrate; a first insulating film provided on the substrate between the source and drain regions; a layer of semiconductor material having a property that its conductivity is changed from an insulative area to a conductive area by a field effect and having energy levels capable of trapping charges, preferably an amorphous semiconductor layer, provided on the first insulating film between the source and drain regions; a second insulating film provided on the amorphous semiconductor layer; a gate electrode provided on the second insulating film; and source and drain electrodes which are respectively in contact with the source and drain regions, at least one of the source and drain electrodes being in contact with the amorphous semiconductor layer.

Although the first insulating layer is not essential for the device function, it may be advantageously provided to offer a conventional insulator-semiconductor interface structure which would facilitate the design of the device parameters, and further the reproducibility thereof.

The non-volatile memory device of the present invention is different from any type of existing non-volatile memory device in that a semiconductor layer, having a conductivity which can be changed over the range of $10^4$ or more by a field effect, particularly, an amorphous semiconductor layer, is used as the layer for capturing and storing charges. As is well known, the amorphous semiconductor shows a resistivity of $10^4$ ohm-cm or higher under the undoped or a little doped impurity condition.

The present invention utilizes the nature of an amorphous semiconductor, namely that it shows an insulation characteristic under normal conditions but allows injection and ejection of charges depending on the direction of an applied field when the field higher than a specific intensity is applied. In addition, the charges once injected do not leak out to the external circuit until a field higher than the specified intensity is applied again.

The amorphous semiconductor can effectively be charged with comparative easiness by injecting charges and then sustaining such charges because it has many charge capturing levels as compared with the other crystalline semiconductors.

Injection of charges, in this case, can be realized, easily by utilizing the field effect of a semiconductor wherein a resistance changes when the field is applied thereto because of variation of the energy band structure of the amorphous semiconductor.

Namely, charge injection to the amorphous semiconductor layer is carried out directly from the source electrode and/or drain electrode, not via the insulating film, under the condition that a high intensity field is applied to this amorphous semiconductor. Therefore, the source electrode and/or drain electrode is directly in contact with the amorphous semiconductor layer. Because of application of high field intensity, it is required to apply a higher voltage to the gate electrode as compared with the voltage during the readout operation, but it is not required to be as high as that in existing non-volatile memory devices. After the high field intensity for write operation is removed, the amorphous semiconductor layer substantially works as an insulating layer, and therefore an unwanted conductive path is not formed even when the source electrode and/or drain electrode is in contact therewith. The charges stored in the amorphous semiconductor layer modifies the charge distribution of the surface of the substrate thereunder and changes the current-voltage characteristics between source and drain of the device to enable the readout operation.

In the case of the present invention, amorphous silicon should desirably be used as the amorphous semiconductor. For the substrate, p type or n type single crystal silicon is desirable The first insulating film provided between the substrate and the amorphous silicon layer may be a silicon dioxide film having a desired thickness, a silicon nitride film etc. The boundary structure between the substrate and first insulating film thus formed is similar to that of a conventional MIS FET. This means that the memory device disclosed by the present invention has no particular problems in reproducibility and stability thereof. This memory device operates as in the case of the ordinary MIS FET because stored data is detected during the readout operation on the basis of the difference between gate threshold voltages-that is, the conductive condition between the source and drain regions depending on the stored charges. When the first insulating film is omitted, the amorphous silicon layer itself works as a gate insulator for the MIS FET operation during the readout operation.

For erasing the stored data, a high intensity field is also applied in the reverse direction from the write operation and thereby the charges having the polarity opposite to the stored charges are injected into the amorphous semiconductor layer. In similar manner, the stored charges may be ejected to perform the erase operation. In place of such electrical erasing method, the known means such as irradiation by ultra-violet rays or high temperature heating can also be employed for the same purpose.

BRIEF DESCRIPTION OF THE DRAWING

The drawing shows a schematic cross-sectional view of the non-volatile memory device according to the preferred embodiment of the present invention.

DETAILED DESCRIPTION OF THE PREFERRED EMBODIMENT

The drawing shows an embodiment of the present invention. In the shown non-volatile memory device, a substrate 10 is composed of n(p) type single crystal silicon and a thick filed insulation film 11 is provided on the surface. The $p^+(n^+)$ type source region 12 and drain region 13 are formed within the substrate 10. A first gate insulating film 14, consisting of an insulator such as silicon dioxide or silicon nitride, is formed in close contact with the substrate surface between the source and drain regions. On the first gate insulating film 14, an undoped amorphous silicon layer 15 is formed, then a second gate insulating film 16 is formed thereon and a gate electrode (control gate electrode) 17 is formed thereon. The second gate insulating film may be of silicon dioxide or silicon nitride, while the gate electrode 17 may be an ordinary metallic electrode such as aluminium. The source electrode 18 and drain electrode 19 consisting of metal such as aluminium, or a conductive semiconductor such as doped polysilicon, are respectively connected to the source region 12 and drain region 13 in ohmic contact therewith and also simultaneously in contact with the an end of the amorphous silicon layer 15. However, the amorphous silicon layer 15 usually has a high resistivity and functions substantially as an insulating layer. Therefore a conductive path is not formed between the source and drain electrodes 18 and 19 via the amorphous silicon layer.

However, in the present invention a field is applied to the amorphous semiconductor layer 15 by applying a voltage to the gate electrode 17 adjacent the amorphous semiconductor layer. As explained above, charge injection becomes possible when the field is applied to the amorphous semiconductor layer 15, and this charge injection is mainly carried out from the source electrode 18, or the drain electrode 19, via the area near the boundary between the amorphous semiconductor layer 15 and the insulating film 16. The charges are mainly injected from the inversion layer formed at the vicinity of the boundary in the amorphous semiconductor layer due to application of the field. For this reason, it is desirable in the present invention that the source electrode 18, or drain electrode 19, be in contact with the boundary between the amorphous semiconductor layer and the insulating film 16, as shown in the figure.

In the device of the present invention, the polarity is different between the voltage applied to the control gate 17 and the voltage applied to the electrode 18 or 19 during charge injection. Therefore, application of a field from the control gate 17 is modified a little by the field applied from the electrode 18 or 19 in the area of amorphous semiconductor layer near the electrode 18 or 19. Thus, the field intensity in the amorphous semiconductor layer 15 becomes the maximum at the center of the layer between the electrodes 18 and 19. Accordingly, the charges injected from the electrode 18 or 19 advance to the central area between the source and drain regions in the amorphous semiconductor layer.

Here, when the voltage being supplied to the control gate 17 is interrupted, the charges are captured in the amorphous semiconductor layer 15 and the charges captured can no longer be ejected even when a relatively low voltage is applied to the source and drain electrodes for readout operations unless a comparatively high voltage is supplied again to the control gate 17. Namely, it is supposed that the charges captured in the amorphous semiconductor layer 15 are mainly concentrated at the area near the boundary of the insulating film 16, and such charges are not output to the external circuits even when the field is applied from the source and drain electrodes 18, 19 unless a sufficiently high voltage is applied to the control gate 17. When the charges are captured in the amorphous semiconductor layer 15, the threshold voltage $V_{TH}$ for ON-OFF between the source region 12 and drain region 13 changes and such condition is held stably. Here, the threshold voltage $V_{TH}$ is about 2 to 3 V in terms of the absolute value even when a maximum voltage of 10 V or higher in terms of absolute value must be applied to the control gate 17 for the charge injection and ejection. Therefore, the charges captured can no longer diffuse out while the device operates as an ordinary MIS type transistor.

The "write," "readout" and "erasing" operations by the semiconductor memory device of the present invention indicated in the figure will be explained below.

For example, it is presumed hereinunder that the semiconductor substrate 10 used here is an n type conductive semiconductor, the source and drain regions 12, 13 are p+ type diffusion regions, and an P channel type semiconductor memory device can be obtained.

First of all, the "write" operation is carried out as follows. Holes are injected into the amorphous semiconductor layer 15 by applying a positive voltage to at least one of the source or drain electrodes 18 or 19 while the control gate 17 is kept at a negative voltage of about 10 V, or higher. Then, the supply of voltage to the source electrode 18, or drain electrode 19, is interrupted while the write voltage is being supplied to the control gate 17. Thereafter, application of the gate voltage is stopped. Thereby, the holes injected into the amorphous semiconductor layer 15 are captured (stored).

Secondly a, "readout" operation is carried out as follows. For example, a voltage is applied to each electrode 18 and 19 in such a manner that the source region 12 is kept at the ground potential or a positive potential, while the drain region 13 is at a negative potential with respect to the source potential. Then the ON-OFF condition between the source and drain regions is detected by applying a negative voltage of, at most, about 2 to 3 V to the control gate 17. In case the holes are captured, the threshold voltage $V_{TH}$ is lowered and therefore the area between the source and drain regions is kept at the OFF condition. Thereby, stored data by the capture of charges can be read.

Thirdly, an "erasing" operation is carried out as follows. The electrons are injected into the amorphous semiconductor layer 15 by applying a negative voltage to at least one of the source or drain electrodes 18 or 19 while the control gate 17 is kept at a positive voltage of about 10 V or higher.

The charge capture of the amorphous semiconductor is carried out though the capture of charges to the energy level existing in the energy gap peculiar to the amorphous condition, but the amount of capture depends on the temperature. Namely, the amount of charges captured changes in accordance with a value of thermal energy given from the outside. It is also possible to adopt such dependency on temperature to the "write," "readout" and "erasing" operations.

As is obvious from the operation principle of the semiconductor memory device of this invention, the present invention does not require in principle such an insulating film 14 as shown in the figure. However it is desirable that the insulating film 14 the formed in order to obtain the same channel formation characteristic between the source and drain regions as that of conventional MIS FETs. In addition, though in the application drawing, both source electrode 18 and drain electrode 19 are connected to the amorphous semiconductor layer 15, as is obvious from the herein disclosed operating principle of the device, it is only required that one be connected.

Moreover, it is particularly desirable for the present invention that the charge capturing region consists of the semiconductor in the amorphous condition, but this semiconductor may contain some impurities and may exhibit crystalline characteristics to some extent if it shows sufficiently high resistivity ($10^4$ ohm-cm or higher) under the condition that no electric field is applied, and if the resistivity can be modified by the field application. In some cases, charges can be captured effectively by allowing an adequate amount of impurites to be contained. Moreover, no special consideration is required for the material of the semiconductor substrate, source and gate electrodes, and the control electrode.

The amorphous semiconductor used in the present invention can be coated on the substrate by the conventional techniques such as sputtering or evaporation. Particularly, it is well known in the semiconductor technology that the amorphous silicon can be coated as well by a plasma decomposition method of monosilane, that is, the glow discharge method, or a reactive sputtering method of a chemical vapor deposition method. The memory device of the embodiment indicated is equivalent to conventional MIS FETs in the terms of the materials and manufacturing methods therefor, except for the amorphous semiconductor layer 15. Therefore, the memory device of the present invention can be obtained by adopting the well known amorphous semiconductor coating technology explained above to the ordinary MIS FET manufacturing process.

I claim:
1. A semiconductor memory device comprising:
a semiconductor substrate of a first conductivity type;
source and drain regions, both of a second conductivity type opposite to said first conductivity type, formed in said semiconductor substrate;
a first insulating film formed on said semiconductor substrate;
means for applying an electric field;
an amorphous semiconductor layer, consisting essentially of an amorphous semiconductor material, formed on said first insulating film and extending between said source and drain regions, capable of storing charges, said amorphous semiconductor layer, operatively connected to said means for applying an electric field, having a first resistivity when the electric field is applied thereto, and having a second resistivity when the electric field is not applied, the first resistivity allowing said amorphous semiconductor layer to be injected with electrons and to become substantially conductive, and the second resistivity allowing said amorphous semiconductor layer to retain charges and to function substantially as an insulating layer;

a second insulating film formed on said amorphous semiconductor layer;

a gate electrode formed on said insulating film; and source and drain electrodes formed in contact with said source and drain regions, respectively, and at least one of said source and drain electrodes directly contacting said amorphous semiconductor layer, for directly injecting charges into said amorphous semiconductor layer from said at least one of said source and drain electrodes, and said amorphous semiconductor layer storing the charges so as to perform a memory function.

2. The semiconductor memory device as claimed in claim 1, wherein said amorphous semiconductor layer comprises an amorphous silicon layer.

3. The semiconductor memory device as claimed in claim 2, wherein said second insulating film comprises silicon dioxide or silicon nitride.

4. The semiconductor memory device as claimed in claim 1, wherein at least one of said source and drain electrodes extends to the interface between said amorphous semiconductor layer and said second insulating film.

5. A semiconductor memory device comprising:

means for applying an electric field;

a semiconductor substrate of a first conductivity type;

source and drain regions of a second conductivity type, opposite to said first conductivity type, formed in said semiconductor substrate;

a first insulating film formed on said semiconductor substrate between said source and drain regions;

means, formed on said first insulating film and extending between said source and drain regions, for directly receiving and storing charges, said means, operatively connected to said means for applying an electric field, having a first resistivity allowing it to become conductive upon application of the electric field, and having a second resistivity allowing it to function substantially as an insulating layer when the electric field is not applied;

a second insulating film formed on said means for storing charges;

a gate electrode formed on said second insulating film; and source and drain electrodes formed in contact with said source and drain regions respectively, at least one of said source and drain electrodes directly contacting said means for storing charges, and for directly injecting charges into said means for storing charges so that said means for storing charges performs a memory operation.

6. A semiconductor memory device as claimed in claim 5, wherein said means for storing charges comprises a semiconductor layer consisting of amorphous silicon.

7. A semiconductor memory device as claimed in claim 6, wherein said first insulating film is selected from the group consisting of silicon dioxide and silicon nitride.

8. A semiconductor memory device as claimed in claim 6, wherein at least one of said source and drain electrodes extends to the interface between said amorphous silicon semiconductor layer and at least one of said first and second insulating films.

9. A semiconductor memory device as claimed in claim 6, wherein at least one of said source and drain electrodes extends to the interface between said amorphous silicon semiconductor layer and each of said first and second insulating films.

10. A semiconductor memory device comprising:

means for applying an electric field;

a semiconductor substrate of a first conductivity type;

source and drain regions of a second conductivity type opposite the first conductivity type and formed in said semiconductor substrate;

an amorphous semiconductor layer consisting essentially of an amorphous semiconductor material, formed on said semiconductor substrate and extending between said source and drain regions, said amorphous semiconductor layer, operatively connected to said means for applying an electric field, having a first resistivity allowing it to become conductive upon application of the electric field, and having a second resistivity allowing it to function substantially as an insulating layer when the electric field is not applied;

at least one insulating film formed adjacent to and in contact with said amorphous semiconductor layer;

a gate electrode formed on said at least one insulating film;

a source electrode formed in contact with said source region;

a drain electrode formed in contact with said drain region; and at least one of said source and drain electrodes directly contacting the interface between said amorphous semiconductor layer and said at least one insulating film for directly injecting charges into said amorphous semiconductor layer.

11. A semiconductor memory device as claimed in claim 10, wherein said amorphous semiconductor layer comprises amorphous silicon layer.

* * * * *

UNITED STATES PATENT AND TRADEMARK OFFICE
CERTIFICATE OF CORRECTION

PATENT NO. : 4,672,408

DATED : June 9, 1987

INVENTOR(S) : TOGEI

It is certified that error appears in the above-identified patent and that said Letters Patent is hereby corrected as shown below:

Column 6, line 14, "the" (second occurrence) should be --be--.
Column 8, line 6, delete "consisting".

Signed and Sealed this

Fifteenth Day of December, 1987

Attest:

DONALD J. QUIGG

*Attesting Officer*  *Commissioner of Patents and Trademarks*